United States Patent
Sakata et al.

(10) Patent No.: US 12,328,100 B2
(45) Date of Patent: Jun. 10, 2025

(54) DOHERTY AMPLIFIER AND COMMUNICATION DEVICE

(71) Applicant: Mitsubishi Electric Corporation, Tokyo (JP)

(72) Inventors: Shuichi Sakata, Tokyo (JP); Yuji Komatsuzaki, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 559 days.

(21) Appl. No.: 17/722,839

(22) Filed: Apr. 18, 2022

(65) Prior Publication Data
US 2022/0239259 A1 Jul. 28, 2022

Related U.S. Application Data (63) Continuation of application No. PCT/JP2019/048944, filed on Dec. 13, 2019.

(51) Int. Cl.
*H03F 3/21* (2006.01)
*H03F 1/02* (2006.01)
*H03F 1/56* (2006.01)

(52) U.S. Cl.
CPC ............ *H03F 1/0288* (2013.01); *H03F 1/56* (2013.01); *H03F 3/211* (2013.01); *H03F 2200/451* (2013.01)

(58) Field of Classification Search
CPC .......... H03F 1/0288; H03F 1/56; H03F 3/211; H03F 2200/451; H03F 3/602; H03F 2200/4233; H01P 5/16

(Continued)

(56) References Cited

U.S. PATENT DOCUMENTS

2009/0295473 A1 12/2009 Dupuy et al.
2020/0321918 A1* 10/2020 Grebennikov ........ H03F 1/0288

FOREIGN PATENT DOCUMENTS

JP 2006-339981 A 12/2006
JP 2008-125044 A 5/2008

OTHER PUBLICATIONS

Hallberg et al., "A Doherty Power Amplifier Design Method for Improved Efficiency and Linearity", IEEE Transactions on Microwave Theory and Techniques, Dec. 2016, vol. 64, No. 12, p. 4491-4504.

(Continued)

*Primary Examiner* — Hieu P Nguyen
(74) *Attorney, Agent, or Firm* — Birch, Stewart, Kolasch & Birch, LLP (57) ABSTRACT

A Doherty amplifier is configured in such a manner that: the ratio $Z_3/Z_2$ of a characteristic impedance $Z_3$ of a second transmission line to a characteristic impedance $Z_2$ of a first transmission line is a power division ratio $P_2/P_3$ of a signal to be amplified between a carrier amplifier and a peak amplifier when both of the carrier amplifier and the peak amplifier are saturated; and a resistance value $R_{iso}$ of a resistor is a value obtained by multiplying, by a proportionality coefficient w which is equal to or greater than 0 but less than 1, the sum of the input impedance $Z_{cin0}$ of the carrier amplifier when the carrier amplifier reaches saturation and the input impedance $Z_{pin0}$ of the peak amplifier when the peak amplifier reaches saturation.

8 Claims, 9 Drawing Sheets (58) Field of Classification Search
USPC .............................................. 330/124 R, 295
See application file for complete search history.

(56) References Cited

OTHER PUBLICATIONS

Extended European Search Report dated Oct. 11, 2022 issued in corresponding European Patent Application No. 19 955 647.3.
Chinese Office Action for Chinese Application No. 201980102771.2, dated Sep. 24, 2024, with English translation.
Chongcheawchamnan et al., Miniaturised and Multilayer Wilkinson Divider and Balun for Microwave and Millimeter-wave Applications, IEEE, Aug. 7, 2002, pp. 174-179.

* cited by examiner

DOHERTY AMPLIFIER AND COMMUNICATION DEVICE

CROSS REFERENCE TO RELATED APPLICATIONS

This application is a Continuation of PCT International Application No. PCT/JP2019/048944 filed on Dec. 13, 2019, which is hereby expressly incorporated by reference into the present application.

TECHNICAL FIELD

The present disclosure relates to a Doherty amplifier and a communication device.

BACKGROUND ART

Patent Literature 1 below discloses a Doherty amplifier including an isolation resistance variable divider that divides an input signal into two and outputs the two divided signals, a carrier amplifier circuit that amplifies one of the two signals output from the isolation resistance variable divider, and a peak amplifier circuit that amplifies the other of the two signals. The Doherty amplifier also includes a detection circuit that converts power of an input signal into a voltage and outputs the voltage as an input power level, and a control circuit that varies a division ratio of an input signal in the isolation resistance variable divider by controlling a resistance value of a variable resistor included in the isolation resistance variable divider according to the input power level output from the detection circuit. Since the Doherty amplifier includes the detection circuit and the control circuit, the Doherty amplifier can prevent a decrease in gain of the amplified signal due to a division loss in the isolation resistance variable divider. That is, the Doherty amplifier can prevent a decrease in gain of a combined signal of the signal output from the carrier amplifier circuit and the signal output from the peak amplifier circuit during a period from a backoff to a saturation operation.

In addition, the Doherty amplifier includes a delay circuit that delays the input signal by a time required from when the input signal is input to the detection circuit to when the control circuit finishes varying the division ratio.

CITATION LIST

Patent Literature

Patent Literature 1: JP 2008-125044 A

SUMMARY OF INVENTION

Technical Problem

The Doherty amplifier disclosed in Patent Literature 1 includes a delay circuit that delays an input signal. Therefore, this Doherty amplifier has a problem that the Doherty amplifier cannot output the amplified signal until the delay time of the delay circuit elapses after the input signal is input to the delay circuit.

The present disclosure has been accomplished to solve the above problems, and an object of the present disclosure is to obtain a Doherty amplifier capable of preventing a decrease in gain of a combined signal of a signal output from a carrier amplifier and a signal output from a peak amplifier during a period from a backoff to a saturation operation without having a delay circuit that delays a signal to be amplified.

Solution to Problem

The Doherty amplifier according to the present disclosure includes: a first transmission line having a first end connected to an input terminal to which a signal to be amplified is input; a second transmission line having a first end connected to the input terminal; a resistor connected between a second end of the first transmission line and a second end of the second transmission line; a carrier amplifier to amplify a signal output from the second end of the first transmission line and output the amplified signal to an output combining point; and a peak amplifier to amplify a signal output from the second end of the second transmission line and output the amplified signal to the output combining point, wherein a ratio of a characteristic impedance of the second transmission line to a characteristic impedance of the first transmission line is a power division ratio of the signal to be amplified between the carrier amplifier and the peak amplifier when both of the carrier amplifier and the peak amplifier are saturated, and a resistance value of the resistor is a value obtained by multiplying, by a proportionality coefficient that is equal to or greater than 0 but less than 1, a sum of the input impedance of the carrier amplifier when the carrier amplifier reaches saturation and the input impedance of the peak amplifier when the peak amplifier reaches saturation.

Advantageous Effects of Invention

According to the present disclosure, the Doherty amplifier is configured in such a manner that: the ratio of the characteristic impedance of the second transmission line to the characteristic impedance of the first transmission line is a power division ratio of the signal to be amplified between the carrier amplifier and the peak amplifier when both of the carrier amplifier and the peak amplifier are saturated; and a resistance value of the resistor is a value obtained by multiplying, by a proportionality coefficient that is equal to or greater than 0 but less than 1, a sum of the input impedance of the carrier amplifier when the carrier amplifier reaches saturation and the input impedance of the peak amplifier when the peak amplifier reaches saturation. Therefore, the Doherty amplifier according to the present disclosure can prevent a decrease in gain of a combined signal of a signal output from the carrier amplifier and a signal output from the peak amplifier during a period from a backoff to a saturation operation without having a delay circuit that delays the signal to be amplified.

DESCRIPTION OF EMBODIMENTS

In order to describe the present disclosure in more detail, a mode for carrying out the present disclosure will now be described with reference to the accompanying drawings.

First Embodiment

Figure 1:
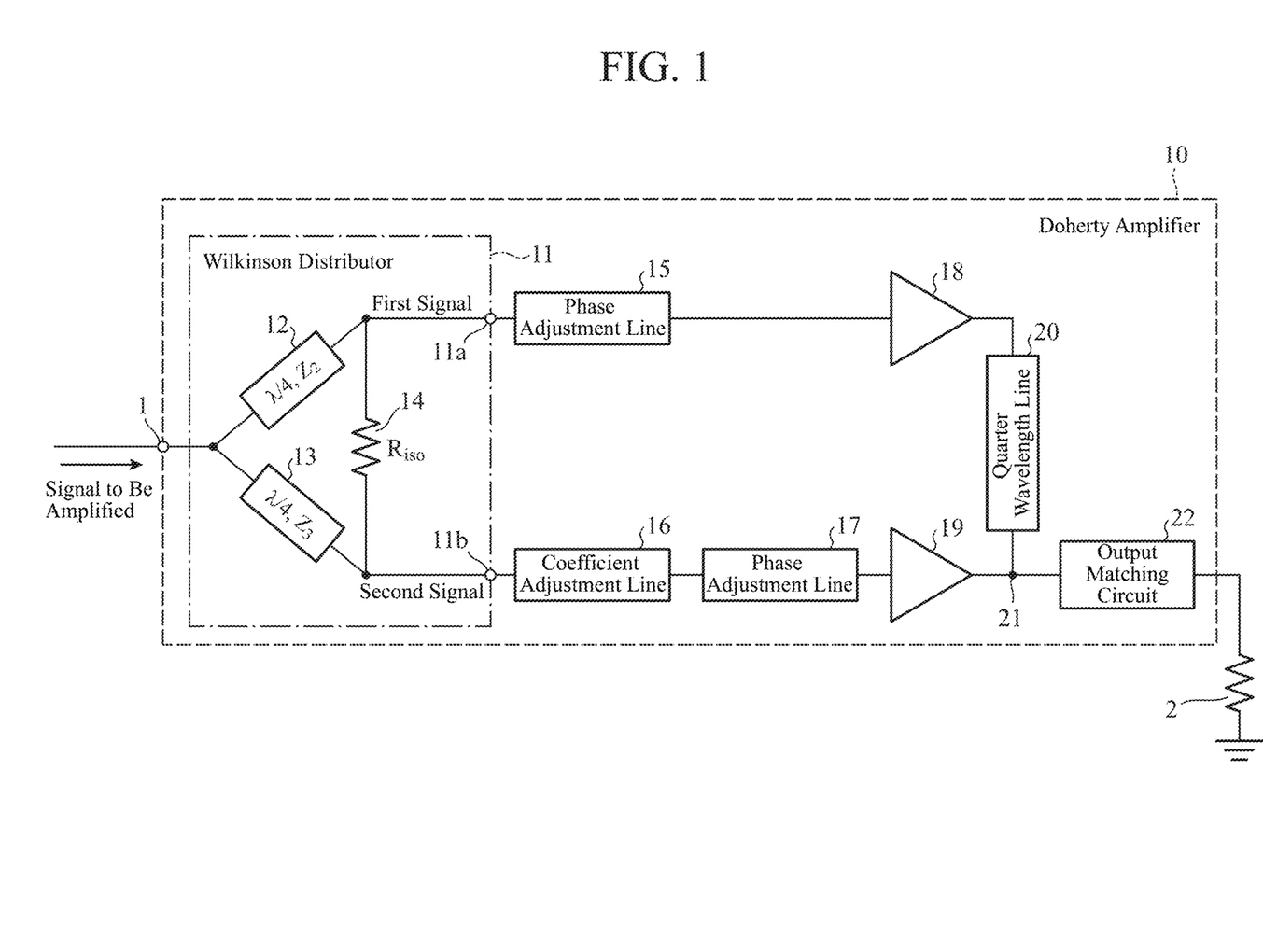
FIG. 1 is a configuration diagram illustrating a Doherty amplifier 10 according to a first embodiment.

FIG. 1 is a configuration diagram illustrating a Doherty amplifier 10 according to a first embodiment.

In FIG. 1, an input terminal 1 is a terminal for receiving a signal to be amplified from the outside of the Doherty amplifier 10.

A load 2 is an external load of the Doherty amplifier 10. A first end of the load 2 is connected to a second end of an output matching circuit 22 to be described later of the Doherty amplifier 10, and a second end of the load 2 is grounded.

The Doherty amplifier 10 amplifies the signal input from the input terminal 1 and outputs the amplified signal to the load 2. The power of the signal input from the input terminal 1 is $P_1$.

A Wilkinson divider 11 includes a first transmission line 12, a second transmission line 13, and a resistor 14.

The Wilkinson divider 11 divides the power $P_1$ of the signal input from the input terminal 1 into two. The Wilkinson divider 11 outputs a first signal from an output terminal 11a to a phase adjustment line 15 to be described later as one of the divided signals and outputs a second signal from an output terminal 11b to a coefficient adjustment line 16 to be described later as the other signal of the divided signals.

A first end of the first transmission line 12 is connected to the input terminal 1, and a second end of the first transmission line 12 is connected to each of a first end of the resistor 14 and the output terminal 11a.

The first transmission line 12 has an electrical length of one-quarter wavelength (hereinafter referred to as "λ/4") at the frequency of the signal input from the input terminal 1. The electrical length of λ/4 is an electrical length of 90 degrees. The characteristic impedance of the first transmission line 12 is $Z_2$.

A first end of the second transmission line 13 is connected to the input terminal 1, and a second end of the second transmission line 13 is connected to each of a second end of the resistor 14 and the output terminal 11b.

The second transmission line 13 has an electrical length of λ/4 at the frequency of the signal input from the input terminal 1. The characteristic impedance of the second transmission line 13 is $Z_3$.

A ratio $Z_3/Z_2$ of the characteristic impedance $Z_3$ of the second transmission line 13 to the characteristic impedance $Z_2$ of the first transmission line 12 is a power division ratio $P_2/P_3$ of a signal to be amplified between the carrier amplifier 18 and the peak amplifier 19 when both of the carrier amplifier 18 and the peak amplifier 19 are saturated. $P_2$ is power of a signal output from the output terminal 11a when the carrier amplifier 18 is saturated. $P_3$ is power of a signal output from the output terminal 11b when the peak amplifier 19 is saturated.

The resistor 14 is connected between the second end of the first transmission line 12 and the second end of the second transmission line 13.

The resistance value $R_{iso}$ of the resistor 14 is a value obtained by multiplying, by a proportionality coefficient w which is equal to or greater than 0 but less than 1, the sum of an input impedance $Z_{cin0}$ of the carrier amplifier 18 when the carrier amplifier 18 reaches saturation and an input impedance $Z_{pin0}$ of the peak amplifier 19 when the peak amplifier 19 reaches saturation.

Hereinafter, the input impedance $Z_{cin0}$ of the carrier amplifier 18 when the carrier amplifier 18 reaches saturation may be referred to as an input impedance at a saturation operation period of the carrier amplifier 18. In addition, the input impedance $Z_{pin0}$ of the peak amplifier 19 when the peak amplifier 19 reaches saturation may be referred to as an input impedance at a saturation operation period of the peak amplifier 19.

The saturation operation period of the carrier amplifier 18 means a period at which the amplification operation of the carrier amplifier 18 on the first signal reaches saturation, and the saturation operation period of the peak amplifier 19 means a period at which the amplification operation of the peak amplifier 19 on the second signal reaches saturation.

A first end of the phase adjustment line 15 is connected to the second end of the first transmission line 12 and the first end of the resistor 14 via the output terminal 11a, and a second end of the phase adjustment line 15 is connected to an input side of the carrier amplifier 18. The phase adjustment line 15 has the same electrical length as the electrical length of the coefficient adjustment line 16. Here, the concept of "the same electrical length" is not limited to a case where the electrical lengths are exactly the same, but includes a case where the electrical lengths are different from each other as long as there is no practical problem.

The characteristic impedance of the phase adjustment line 15 is the same as the input impedance $Z_{cin0}$ of the carrier amplifier 18. The concept of "the same electrical length" here is not limited to a case where the characteristic impedance of the phase adjustment line 15 and the input impedance $Z_{cin0}$ of the carrier amplifier 18 are exactly the same, but includes a case where they are different from each other as long as there is no practical problem.

A first end of the coefficient adjustment line 16 is connected to each of the second end of the second transmission line 13 and the second end of the resistor 14 via the output terminal 11b, and a second end of the coefficient adjustment line 16 is connected to a first end of a phase adjustment line 17 to be described later. The coefficient adjustment line 16 is a line for adjusting a reflection coefficient $\Gamma_{pin}$ of the second signal at the peak amplifier 19, which is obtained when the peak amplifier 19 is viewed from the second end of the second transmission line 13.

The first end of the phase adjustment line 17 is connected to the second end of the coefficient adjustment line 16, and a second end of the phase adjustment line 17 is connected to an input side of the peak amplifier 19. The phase adjustment line 17 has an electrical length of $\lambda/4$ at the frequency of the signal input from the input terminal 1.

Each of the characteristic impedance of the coefficient adjustment line 16 and the characteristic impedance of the phase adjustment line 17 is the same as the input impedance $Z_{pin0}$ at the saturation operation period of the peak amplifier 19. The concept of "the same" here is not limited to a case where the impedances are exactly the same, but includes a case where the impedances are different from each other as long as there is no practical problem.

Since the phase adjustment line 17 is inserted between the coefficient adjustment line 16 and the peak amplifier 19, a phase difference between a path from the carrier amplifier 18 to an output combining point 21 to be described later and a path from the peak amplifier 19 to the output combining point 21 is compensated for.

The input side of the carrier amplifier 18 is connected to the second end of the phase adjustment line 15, and an output side of the carrier amplifier 18 is connected to a first end of a quarter wavelength line 20 described later. The carrier amplifier 18 amplifies the first signal that is output from the second end of the first transmission line 12 and then passes through the phase adjustment line 15, and outputs the amplified first signal to the output combining point 21 via the quarter wavelength line 20.

Since the carrier amplifier 18 is biased to class AB, the input impedance $Z_{cin0}$ of the carrier amplifier 18 does not change during the period from a linear operation to the saturation operation. The linear operation period means a period at which the carrier amplifier 18 starts an amplification operation on the first signal, and at the linear operation period, the peak amplifier 19 has not started an amplification operation on the second signal.

In the Doherty amplifier 10 illustrated in FIG. 1, the saturation operation period of the carrier amplifier 18 and the period the saturation operation of the peak amplifier 19 occur simultaneously. The concept of "simultaneously" here is not limited to a case where the periods of the saturation operation are exactly the same, but includes a case where the periods of the saturation operation are different from each other as long as there is no practical problem.

There is a backoff period between the linear operation and the saturation operation, and the backoff means a period during which the amplification operation of the peak amplifier 19 for the second signal is rapidly started.

Figure 2:
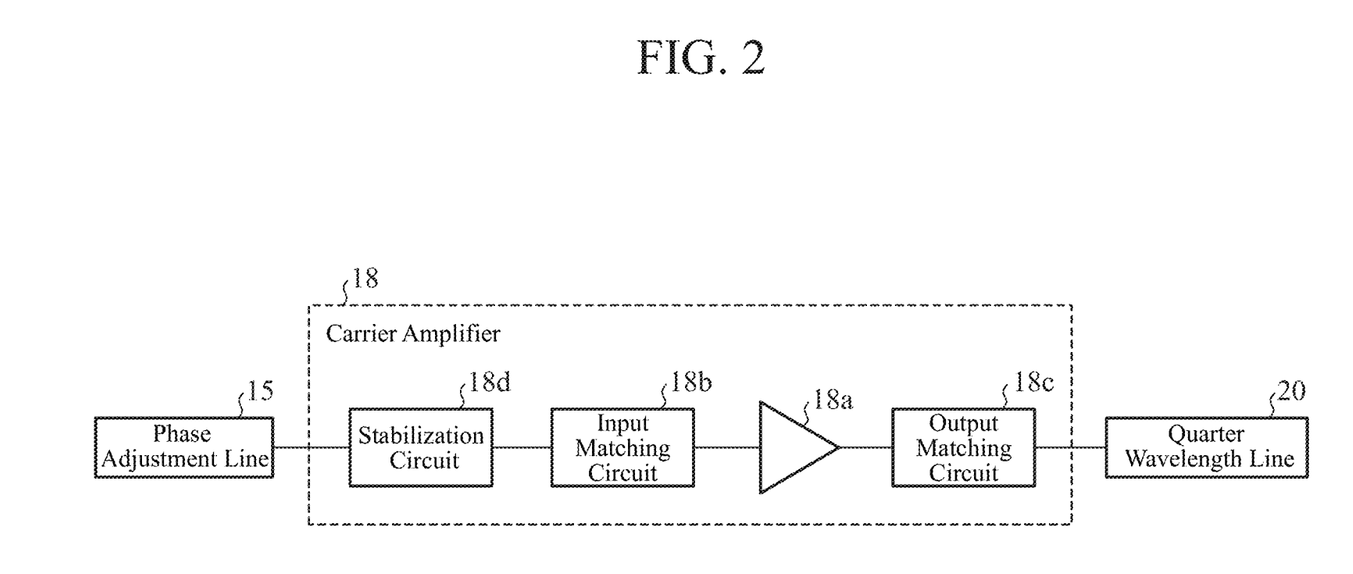
FIG. 2 is a configuration diagram illustrating the inside of a carrier amplifier 18.

FIG. 2 is a configuration diagram illustrating the inside of the carrier amplifier 18.

As illustrated in FIG. 2, the carrier amplifier 18 includes, in addition to a transistor 18a that amplifies the first signal, an input matching circuit 18b connected to an input side of the transistor 18a and an output matching circuit 18c connected to an output side of the transistor 18a.

In addition, as illustrated in FIG. 2, the carrier amplifier 18 includes a stabilization circuit 18d that blocks passage of frequency components other than a desired frequency component included in the first signal and allows passage of the desired frequency component.

The stabilization circuit 18d is connected between the phase adjustment line 15 and the input matching circuit 18b, and is implemented by, for example, a low-pass filter, a band-pass filter, or a high-pass filter.

In FIG. 2, the stabilization circuit 18d is connected between the phase adjustment line 15 and the input matching circuit 18b. However, this is merely an example, and the stabilization circuit 18d may be connected between the input matching circuit 18b and the transistor 18a, between the transistor 18a and the output matching circuit 18c, or between the output matching circuit 18c and the quarter wavelength line 20.

The input side of the peak amplifier 19 is connected to the second end of the phase adjustment line 17, and the output side of the peak amplifier 19 is connected to the output combining point 21. The peak amplifier 19 amplifies the second signal that is output from the second end of the second transmission line 13 and then passes through the coefficient adjustment line 16 and the phase adjustment line 17, and outputs the amplified second signal to the output combining point 21.

Since the peak amplifier 19 is biased to class C, the input impedance $Z_{pin0}$ of the peak amplifier 19 greatly changes during the period from the linear operation to the saturation operation.

Figure 3:
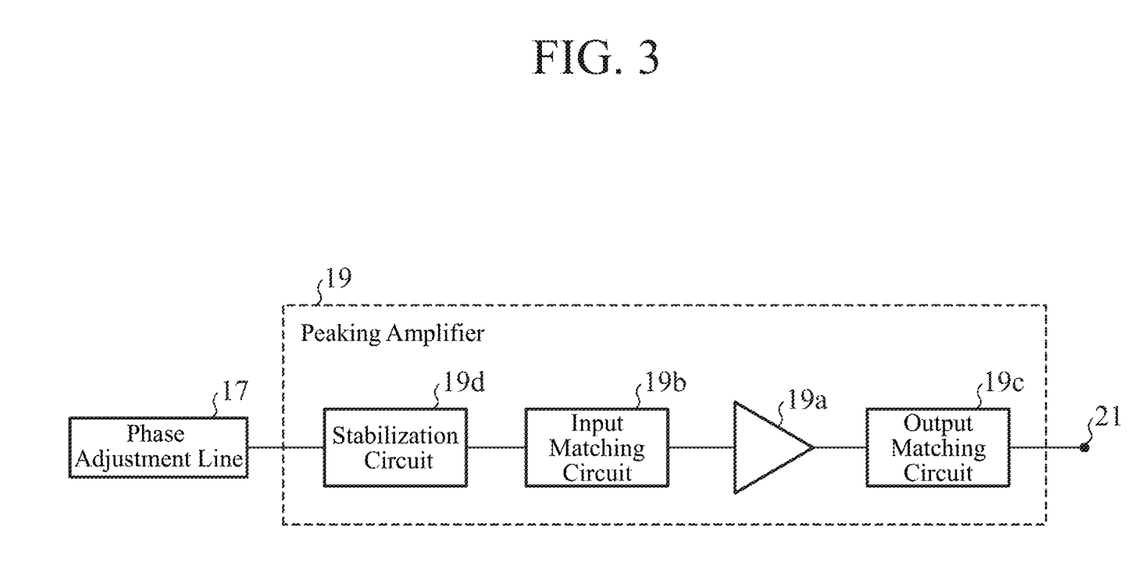
FIG. 3 is a configuration diagram illustrating the inside of a peak amplifier 19.

FIG. 3 is a configuration diagram illustrating the inside of the peak amplifier 19.

As illustrated in FIG. 3, the peak amplifier 19 includes, in addition to a transistor 19a that amplifies the second signal, an input matching circuit 19b connected to an input side of the transistor 19a, and an output matching circuit 19c connected to an output side of the transistor 19a.

Furthermore, as illustrated in FIG. 3, the peak amplifier 19 includes a stabilization circuit 19d that blocks passage of frequency components other than a desired frequency component included in the second signal and allows passage of the desired frequency component.

The stabilization circuit 19d is connected between the phase adjustment line 17 and the input matching circuit 19b, and is implemented by, for example, a low-pass filter, a band-pass filter, or a high-pass filter.

In FIG. 2, the stabilization circuit 19d is connected between the phase adjustment line 17 and the input matching circuit 19b. However, this is merely an example, and the stabilization circuit 19d may be connected between the input matching circuit 19b and the transistor 19a, between the transistor 19a and the output matching circuit 19c, or between the output matching circuit 19c and the output combining point 21.

The first end of the quarter wavelength line 20 is connected to the output side of the carrier amplifier 18, and a second end of the quarter wavelength line 20 is connected to the output combining point 21. The quarter wavelength line 20 has an electrical length of $\lambda/4$ at the frequency of the signal input from the input terminal 1. The quarter wavelength line 20 is connected between the carrier amplifier 18 and the output combining point 21 in order to modulate the impedance at the backoff period.

The output side of the peak amplifier 19 and the second end of the quarter wavelength line 20 are connected to the output combining point 21. The amplified first signal output from the carrier amplifier 18 and then passing through the quarter wavelength line 20 and the amplified second signal output from the peak amplifier 19 are combined in phase at the output combining point 21.

A first end of the output matching circuit 22 is connected to the output combining point 21, and the second end of the output matching circuit 22 is connected to the load 2. The output matching circuit 22 is provided to match the impedance on the output side of the Doherty amplifier 10 with the impedance of the load 2.

Since the carrier amplifier 18 is biased to class AB, the input impedance $Z_{cin0}$ of the carrier amplifier 18 does not change during the period from the linear operation to the saturation operation. The characteristic impedance of the phase adjustment line 15 is the same as the input impedance $Z_{cin0}$ of the carrier amplifier 18 during the period from the linear operation to the saturation operation of the carrier amplifier 18.

Therefore, the absolute value of the input reflection when the carrier amplifier 18 is viewed from the output terminal 11a of the Wilkinson divider 11 is 0 during the period from the linear operation to the saturation operation of the carrier amplifier 18.

Each of the characteristic impedance of the coefficient adjustment line 16 and the characteristic impedance of the phase adjustment line 17 is the same as the input impedance $Z_{pin0}$ at the saturation operation period of the peak amplifier 19.

Unlike the carrier amplifier 18, the peak amplifier 19 is biased to class C, so that the input impedance $Z_{pin0}$ of the peak amplifier 19 greatly changes during the period from the linear operation to the saturation operation.

Therefore, the characteristic impedance of the coefficient adjustment line 16 and the characteristic impedance of the phase adjustment line 17 are different from the input impedance $Z_{pin0}$ of the peak amplifier 19 at a period other than the saturation operation period of the peak amplifier 19.

Figure 4:
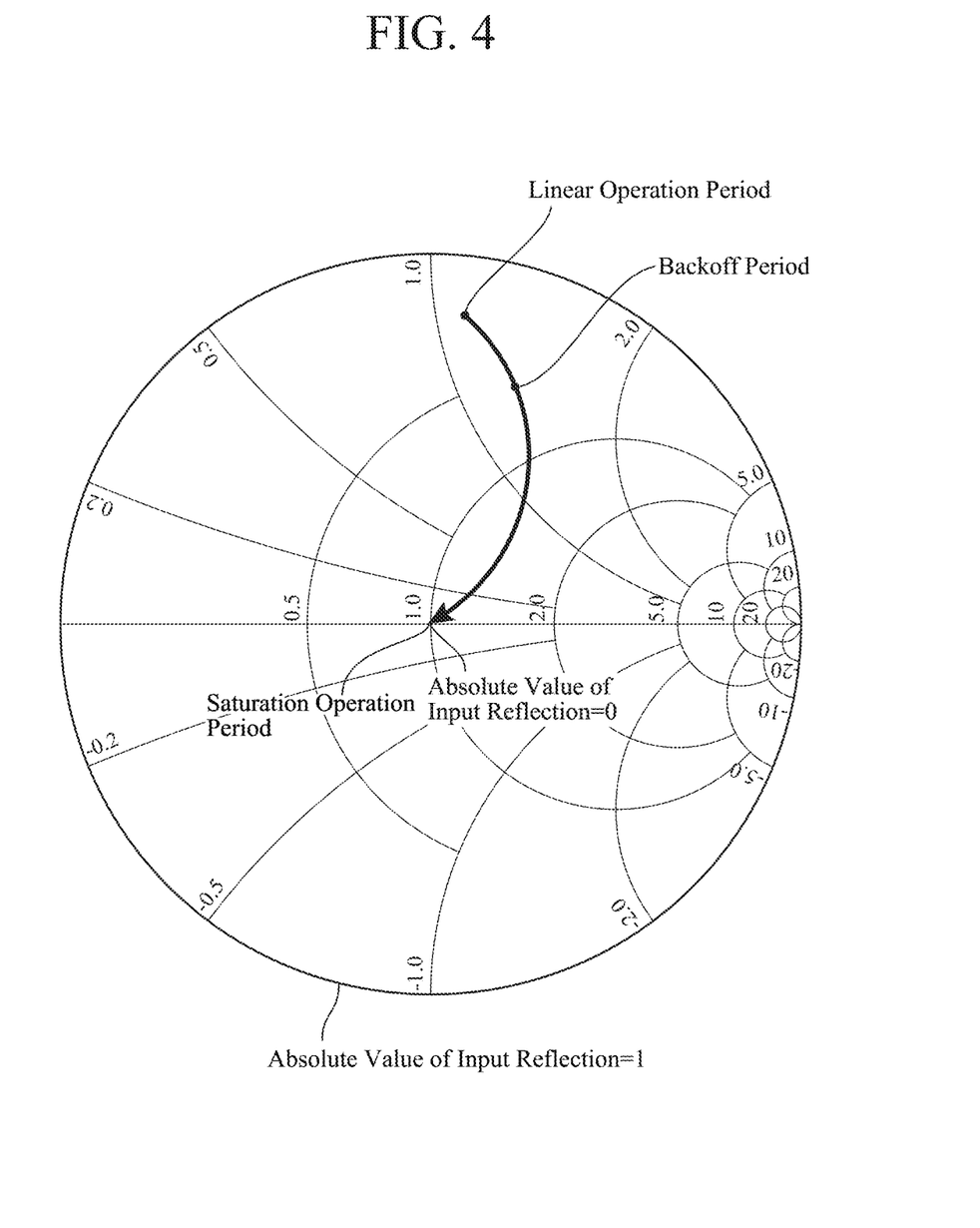
FIG. 4 is a Smith chart illustrating input reflection of the peak amplifier 19 during a period from a linear operation to a saturation operation of the Doherty amplifier illustrated in FIG. 1.

FIG. 4 is a Smith chart illustrating input reflection of the peak amplifier 19 during the period from the linear operation to the saturation operation of the Doherty amplifier 10 illustrated in FIG. 1. FIG. 4 illustrates input reflection of the peak amplifier 19 when the peak amplifier 19 is viewed from the input side of the coefficient adjustment line 16.

The impedance at the center of the Smith chart illustrated in FIG. 4 is the input impedance $Z_{pin0}$ at the saturation operation period of the peak amplifier 19. The impedance at the center of the Smith chart illustrated in FIG. 4 is normalized by the input impedance $Z_{pin0}$ at the saturation operation period of the peak amplifier 19, and thus expressed as 1.0.

At the saturation operation period of the peak amplifier 19, the absolute value of the input reflection of the peak amplifier 19 is 0 as illustrated in FIG. 4.

At the linear operation period of the peak amplifier 19, the absolute value of the input reflection of the peak amplifier 19 is not 0 but nearly 1 as illustrated in FIG. 4.

Figure 5:
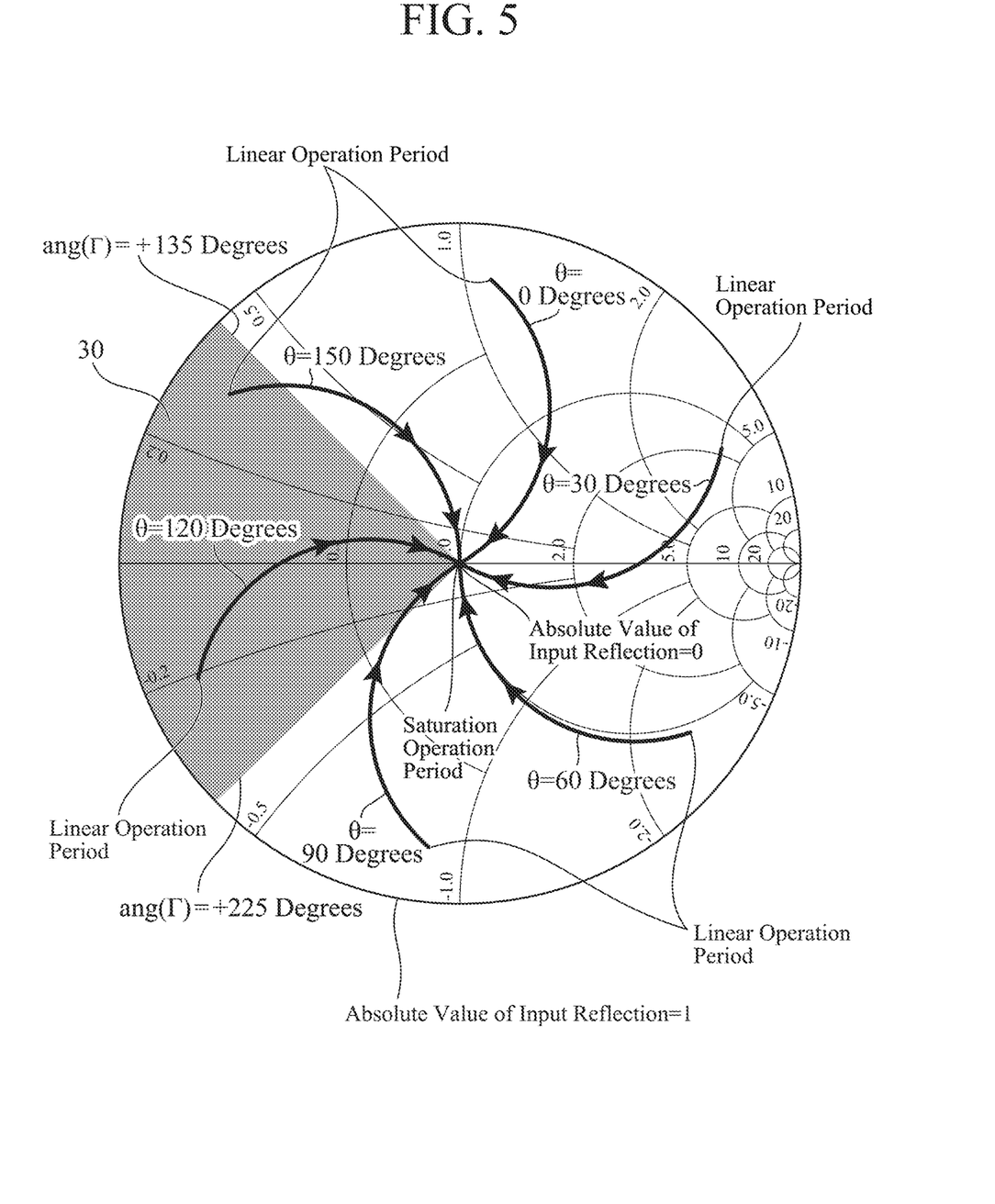
FIG. 5 is a Smith chart illustrating input reflection of the peak amplifier 19 during a period from a linear operation to a saturation operation of the Doherty amplifier illustrated in FIG. 1.

FIG. 5 is a Smith chart illustrating input reflection of the peak amplifier 19 during the period from the linear operation to the saturation operation of the Doherty amplifier 10 illustrated in FIG. 1.

FIG. 5 illustrates input reflection of the peak amplifier 19 when the electrical length of the coefficient adjustment line 16 is 0 degrees, 30 degrees, 60 degrees, 90 degrees, 120 degrees, and 150 degrees. The input reflection of the peak amplifier 19 when the electrical length of the coefficient adjustment line 16 is 0 degrees is the same as the input reflection of the peak amplifier 19 illustrated in FIG. 4.

Each of the characteristic impedance of the coefficient adjustment line 16 and the characteristic impedance of the phase adjustment line 17 is the same as the input impedance $Z_{pin0}$ at the saturation operation period of the peak amplifier 19 even if the electrical length of the coefficient adjustment line 16 varies. Therefore, when the electrical length of the coefficient adjustment line 16 varies, the phase of the input reflection at the linear operation period of the peak amplifier 19 changes.

Therefore, the input reflection of the peak amplifier 19 when the peak amplifier 19 is viewed from the input side of the coefficient adjustment line 16 rotates on the Smith chart depending on the electrical length of the coefficient adjustment line 16 as illustrated in FIG. 5.

Note that the phase of the input reflection of the peak amplifier 19 changes depending on the type of the transistor 19a included in the peak amplifier 19 or the type of each of the input matching circuit 19b and the output matching circuit 19c.

There is a range of the input reflection phase for achieving an ideal operation of the Doherty amplifier 10 illustrated in FIG. 1.

The ideal operation means an operation satisfying the following two conditions.

Condition (1)

After the carrier amplifier 18 starts the signal amplification operation before the peak amplifier 19, the peak amplifier 19 rapidly starts the signal amplification operation from the backoff period between the linear operation and the saturation operation.

Condition (2)

The saturation operation period of the carrier amplifier 18 and the saturation operation period of the peak amplifier 19 occur simultaneously.

A range 30 of the input reflection phase illustrated in FIG. 5 indicates a range of the input reflection phase necessary for achieving the ideal operation of the Doherty amplifier 10 illustrated in FIG. 1 when the peak amplifier 19 is viewed from the output terminal 11b of the Wilkinson divider 11. The range 30 is known when the Doherty amplifier 10 illustrated in FIG. 1 is designed.

In the example of FIG. 5, the range 30 of the input reflection phase when the peak amplifier 19 is viewed from the output terminal 11b illustrated in FIG. 1 is from 135 degrees to 220 degrees.

In the example of FIG. 5, when the phase of the input reflection of the peak amplifier 19 is 120 degrees, the phase of the input reflection of the peak amplifier 19 is included in the range 30 of the input reflection phase of the Doherty amplifier 10.

In the Doherty amplifier 10 illustrated in FIG. 1, in order to satisfy the condition (1), the electrical length of the coefficient adjustment line 16 is set so that the phase of the input reflection of the peak amplifier 19 is included in the range 30 of the input reflection phase upon designing the Doherty amplifier 10.

In addition, in the Doherty amplifier 10 illustrated in FIG. 1, in order to satisfy both the condition (1) and the condition (2), the resistance value $R_{iso}$ of the resistor 14 is a value obtained by multiplying, by the proportionality coefficient w which is equal to or greater than 0 but less than 1, the sum of the input impedance $Z_{cin0}$ at the saturation operation period of the carrier amplifier 18 and the input impedance $Z_{pin0}$ at the saturation operation period of the peak amplifier 19.

Next, the operation of the Doherty amplifier 10 illustrated in FIG. 1 will be described.

When a signal to be amplified is input from the input terminal 1, the Wilkinson divider 11 divides power $P_1$ of the input signal into two.

The Wilkinson divider 11 outputs the first signal as one of the divided signals from the output terminal 11a to the carrier amplifier 18 via the phase adjustment line 15.

In addition, the Wilkinson divider 11 outputs the second signal as the other of the divided signals from the output terminal 11b to the peak amplifier 19 via the coefficient adjustment line 16 and the phase adjustment line 17.

The details of the operation of the Wilkinson divider 11 will be described later.

The carrier amplifier 18 amplifies the first signal output from the output terminal 11a of the Wilkinson divider 11 and then passing through the phase adjustment line 15.

The carrier amplifier 18 outputs the amplified first signal to the output combining point 21 via the quarter wavelength line 20.

The peak amplifier 19 amplifies the second signal output from the output terminal 11b of the Wilkinson divider 11 and then passing through each of the coefficient adjustment line 16 and the phase adjustment line 17.

The peak amplifier 19 amplifies the second signal and outputs the amplified second signal to the output combining point 21.

The amplified first signal output from the carrier amplifier 18 and then passing through the quarter wavelength line 20 and the amplified second signal output from the peak amplifier 19 are combined in phase at the output combining point 21.

The combined signal (hereinafter, referred to as a "composite signal") at the output combining point 21 is output to the load 2 via the output matching circuit 22.

Next, the operation of the Wilkinson divider 11 will be described in detail.

Figure 6:
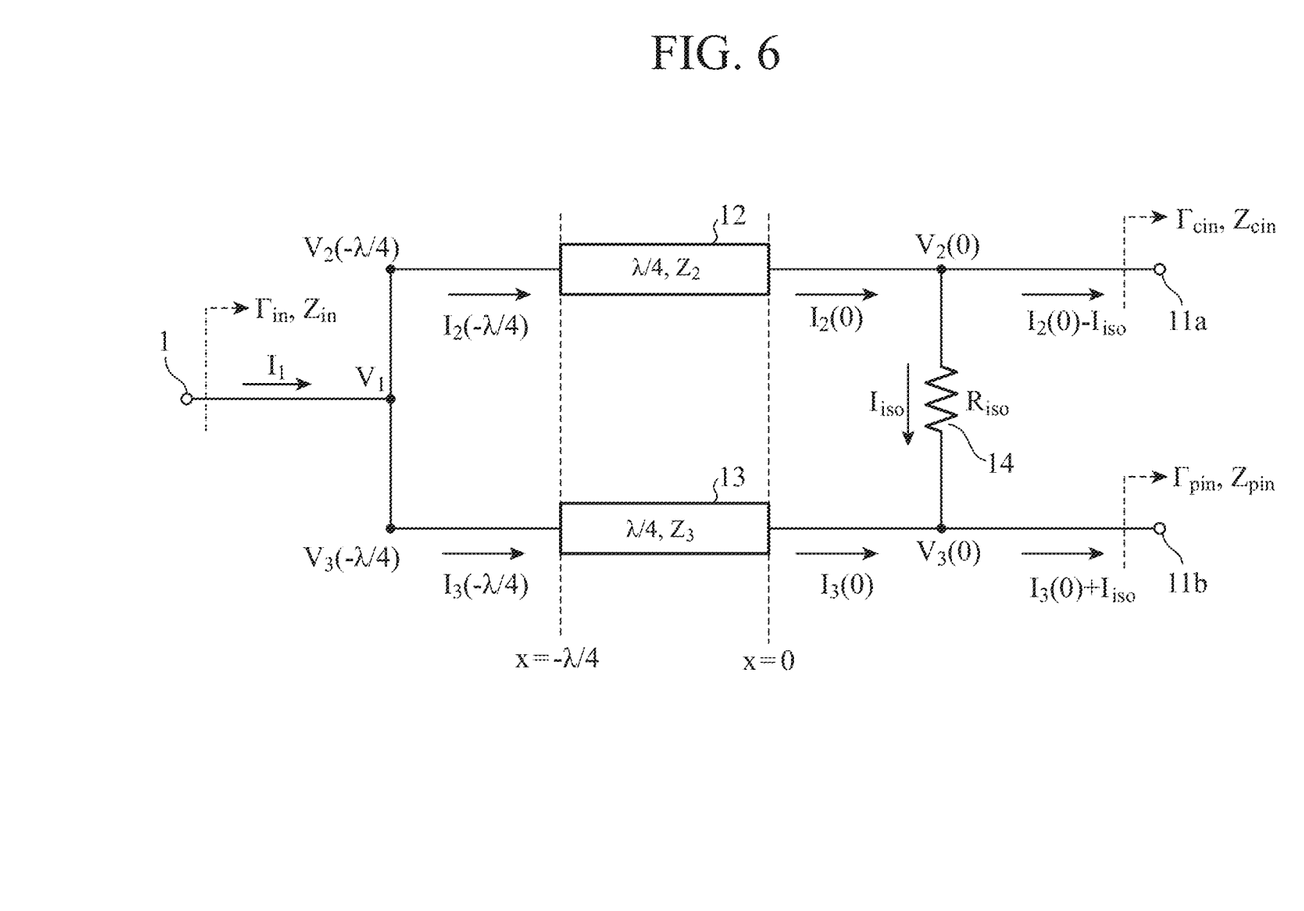
FIG. 6 is a configuration diagram illustrating details of a Wilkinson divider 11.

FIG. 6 is a configuration diagram illustrating the detail of the Wilkinson divider 11.

In FIG. 6, $I_1$ is a current of the signal input from the input terminal 1, and $V_1$ is a voltage of the signal input from the input terminal 1.

$Z_{in}$ is an input impedance of the Doherty amplifier 10 illustrated in FIG. 1, and $\Gamma_{in}$ is a reflection coefficient of the input signal at the Doherty amplifier 10 when the inside of the Doherty amplifier 10 is viewed from the input terminal 1.

$I_2(-\lambda/4)$ is a current of the signal input to the first transmission line 12, and $V_2(-\lambda/4)$ is a voltage of the signal input to the first transmission line 12.

$I_2(0)$ is a current of the signal output from the first transmission line 12, and $V_2(0)$ is a voltage of the signal output from the first transmission line 12.

$I_3(-\lambda/4)$ is a current of the signal input to the second transmission line 13, and $V_3(-\lambda/4)$ is a voltage of the signal input to the second transmission line 13.

$I_3(0)$ is a current of the signal output from the second transmission line 13, and $V_3(0)$ is a voltage of the signal output from the second transmission line 13.

$I_{iso}$ is a current flowing through the resistor 14, $I_2(0)-I_{iso}$ is a current of a signal output from the output terminal 11a to the phase adjustment line 15, and $I_3(0)+I_{iso}$ is a current of a signal output from the output terminal 11b to the coefficient adjustment line 16.

$Z_{cin}$ is an impedance when the carrier amplifier 18 is viewed from the output terminal 11a, and $\Gamma_{cin}$ is a reflection coefficient of the first signal in the carrier amplifier 18 when the carrier amplifier 18 is viewed from the output terminal 11a.

$Z_{pin}$ is an impedance when the peak amplifier 19 is viewed from the output terminal 11b, and $\Gamma_{pin}$ is a reflection coefficient of the second signal at the peak amplifier 19 when the peak amplifier 19 is viewed from the output terminal 11b.

The relationship among the impedance $Z_{cin}$ when the carrier amplifier 18 is viewed from the output terminal 11a, the input impedance $Z_{cin0}$ at the saturation operation period of the carrier amplifier 18, and the reflection coefficient $\Gamma_{cin}$ of the first signal is expressed by Equation (1) below.

$$\frac{Z_{cin}}{Z_{cin0}} = \frac{1 + \Gamma_{cin}}{1 - \Gamma_{cin}} \quad (1)$$

The relationship among the impedance $Z_{pin}$ when the peak amplifier 19 is viewed from the output terminal 11b, the input impedance $Z_{pin0}$ at the saturation operation period of the peak amplifier 19, and the reflection coefficient $\Gamma_{pin}$ of the second signal is expressed by Equation (2) below.

$$\frac{Z_{pin}}{Z_{pin0}} = \frac{1 + \Gamma_{pin}}{1 - \Gamma_{pin}} \quad (2)$$

Since the input impedance $Z_{cin0}$ of the carrier amplifier 18 does not change during the period from the linear operation to the saturation operation, the input reflection coefficient of the carrier amplifier 18 is constantly $\Gamma_{cin}=0$.

Since the input impedance $Z_{pin0}$ of the peak amplifier 19 changes during the period from the linear operation to the saturation operation, the reflection coefficient $\Gamma_{pin}$ of the second signal at the peak amplifier 19 changes depending on the electrical length of the coefficient adjustment line 16 as illustrated in FIG. 5.

Hereinafter, the operation of the Wilkinson divider 11 when both the carrier amplifier 18 and the peak amplifier 19 are saturated and the operation of the Wilkinson divider 11 during the period from the linear operation to the saturation operation will be described.

[Operation of Wilkinson Divider 11 When Both Carrier Amplifier 18 and Peak Amplifier 19 are Saturated]

When both the carrier amplifier 18 and the peak amplifier 19 are saturated, the power division ratio $P_2/P_3$ of the signal in the Wilkinson divider 11 matches a desired power division ratio $1/K^2$. The power division ratio $P_2/P_3$ is a power division ratio $P_2/P_3$ with respect to the power $P_2$ of the first signal output from the output terminal 11a toward the carrier amplifier 18 and the power $P_3$ of the second signal output from the output terminal 11b toward the peak amplifier 19.

When both the carrier amplifier 18 and the peak amplifier 19 are saturated, the relationship among the ratio $Z_3/Z_2$ of the characteristic impedance $Z_3$ of the second transmission line 13 to the characteristic impedance $Z_2$ of the first transmission line 12, the ratio $Z_{pin0}/Z_{cin0}$ of the input impedance $Z_{pin0}$ of the peak amplifier 19 to the input impedance $Z_{cin0}$ of the carrier amplifier 18, and the power division ratio $P_2/P_3$ is expressed by Equation (3) below.

$$\frac{P_2}{P_3} = \frac{Z_{pin0}}{Z_{cin0}} = \frac{Z_3}{Z_2} = \frac{1}{K^2} \quad (3)$$

When the Doherty amplifier 10 illustrated in FIG. 1 is designed, the input impedance $Z_{in}$ of the Doherty amplifier 10 and the input impedance $Z_{cin0}$ at the saturation operation period of the carrier amplifier 18 are known.

Therefore, the characteristic impedance $Z_2$ of the first transmission line 12 can be obtained by substituting the input impedance $Z_{in}$ and the input impedance $Z_{cin0}$ into Equation (4) below.

$$Z_2 = \sqrt{Z_{in}Z_{cin0}(1 + K^2)} \quad (4)$$

The characteristic impedance $Z_3$ of the second transmission line 13 can be obtained by substituting the characteristic impedance $Z_2$ of the first transmission line 12 into Equation (5) below.

$$Z_3 = \frac{Z_2}{K^2} \quad (5)$$

When the resistance value $R_{iso}$ of the resistor 14 matches the sum of the input impedance $Z_{cin0}$ and the input impedance $Z_{pin0}$ as indicated in Equation (6) below, no current flows through the resistor 14, and thus the output terminal 11a and the output terminal 11b are isolated.

$$R_{iso} = Z_{cin0} + Z_{pin0} = Z_{cin0}\left(1 + \frac{1}{K^2}\right) \quad (6)$$

When the resistance value $R_{iso}$ of the resistor 14 is a value obtained by multiplying the resistance value $R_{iso}$ indicated in Equation (6) by a proportionality coefficient w which is equal to or greater than 0 but less than 1 as indicated in Equation (7) below, a current flows through the resistor 14. The current flowing through the resistor 14 changes the power division ratio $P_2/P_3$ at a period other than the saturation operation period of the Doherty amplifier 10 illustrated in FIG. 1. However, when both the carrier amplifier 18 and the peak amplifier 19 are saturated, the power division ratio $P_2/P_3$ does not change and matches the desired power division ratio $1/K^2$ even if the current flows through the resistor 14.

$$R_{iso} = wZ_{cin0}\left(1 + \frac{1}{K^2}\right) \quad (7)$$
$$(1 > w \geq 0)$$

[Operation of Wilkinson Divider 11 During a Period From Linear Operation to Saturation Operation]

The power division ratio $P_2/P_3$ during a period from the linear operation to the saturation operation of the Doherty amplifier 10 is expressed by Equation (8) below.

$$\frac{P_2}{P_3} = \frac{1}{K^2} \cdot \frac{|1 + X(w)\Gamma_{pin}|^2}{1 - |\Gamma_{pin}|^2} \quad (8)$$

$$X(w) = \frac{1 - w}{1 + w} \quad (9)$$

The power division ratio $P_2/P_3$ during a period from the linear operation to the saturation operation of the Doherty amplifier 10 varies depending on the proportionality coefficient w as indicated by Equation (8).

Figure 7:
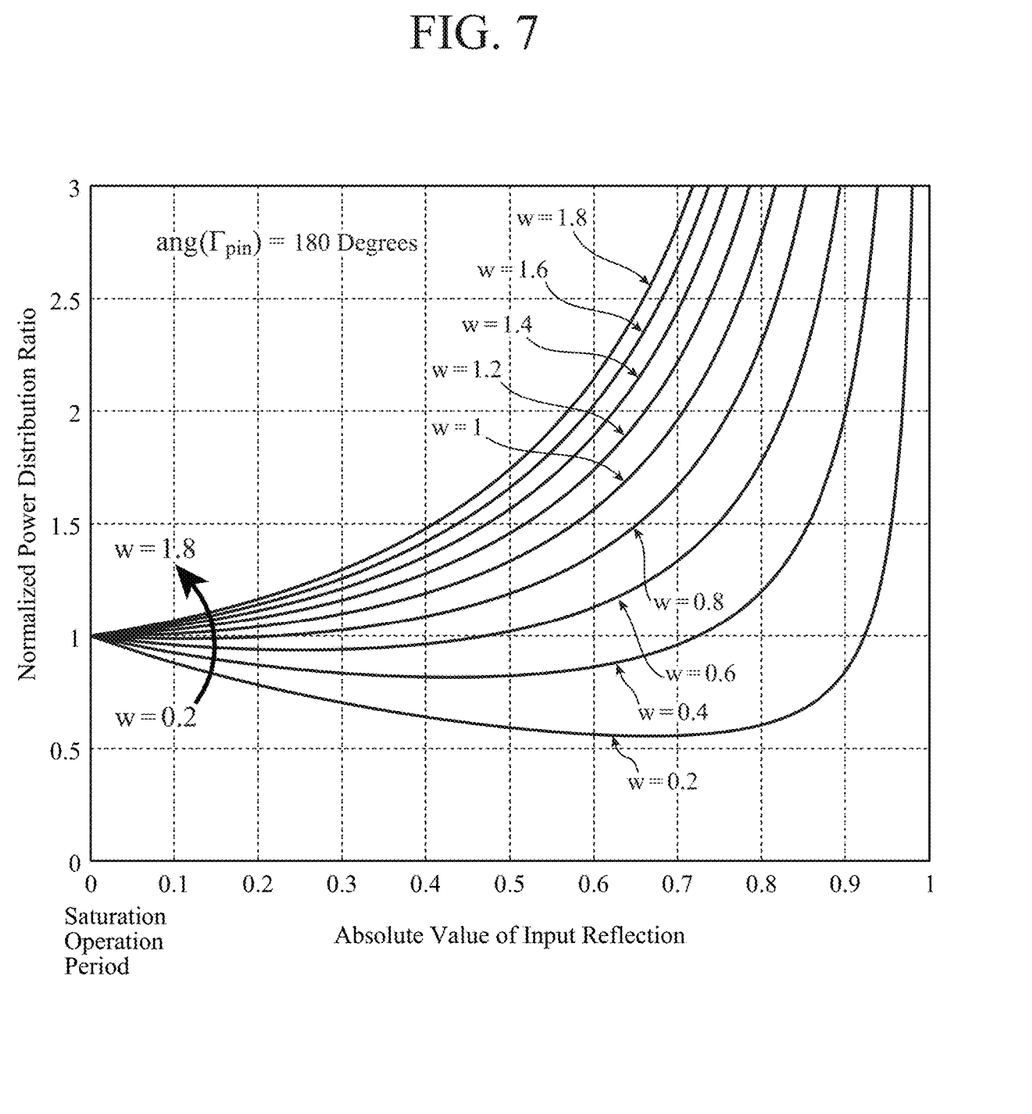
FIG. 7 is an explanatory diagram illustrating normalized power division ratios of a case where a proportionality coefficient w is changed from 0.2 to 1.8 in 0.2 steps with the phase of a reflection coefficient $\Gamma_{pin}$ when the peak amplifier 19 is viewed from an output terminal 11b of the Wilkinson divider 11 being 180 degrees.

FIG. 7 is an explanatory diagram illustrating normalized power division ratios of a case where the proportionality coefficient w is changed from 0.2 to 1.8 in 0.2 steps with the phase of the reflection coefficient $\Gamma_{pin}$ when the peak amplifier 19 is viewed from the output terminal 11b of the Wilkinson divider 11 being 180 degrees.

In FIG. 7, the horizontal axis represents an absolute value of the input reflection of the peak amplifier 19, and the peak amplifier 19 is saturated when the absolute value of the input reflection is 0. At the linear operation period of the peak amplifier 19, the absolute value of the input reflection is nearly 1.

The vertical axis represents a normalized power division ratio in a range from the linear operation to the saturation operation of the Doherty amplifier 10. The normalized power division ratio is obtained by normalizing the power division ratio $P_2/P_3$ by $1/K^2$. Therefore, when the normalized power division ratio is 1, the power division ratio $P_2/P_3$ is $1/K^2$.

As illustrated in FIG. 7, when the peak amplifier 19 is saturated, the normalized power division ratio is 1, and the power division ratio $P_2/P_3$ is $1/K^2$, despite the change of the proportionality coefficient w within the range from 0.2 to 1.8.

When the absolute value of the input reflection of the peak amplifier 19 is larger than 0 and the peak amplifier 19 is not at the saturation operation period, the normalized power division ratio changes depending on the proportionality coefficient w as illustrated in FIG. 7.

In a case where the proportionality coefficient w is equal to or larger than 1, the normalized power division ratio is always equal to or larger than 1, regardless of the absolute value of the input reflection of the peak amplifier 19, as illustrated in FIG. 7. Thus, power to be distributed to the carrier amplifier 18 is more than power to be distributed to the peak amplifier 19 during the period from the linear operation to the saturation operation of the Doherty amplifier 10.

Therefore, when the proportionality coefficient w is equal to or larger than 1, it is difficult to rapidly start the operation of the peak amplifier 19 at the backoff period. For this reason, the carrier amplifier 18 may reach saturation before the peak amplifier 19 reaches saturation, and thus, it is difficult to achieve an ideal operation of simultaneously saturating the carrier amplifier 18 and the peak amplifier 19.

When the proportionality coefficient w is less than 1, there is an absolute value of the input reflection of the peak amplifier 19 at which the normalized power division ratio is less than 1, as illustrated in FIG. 7.

For example, when the proportionality coefficient w is 0.4, the normalized power division ratio is smaller than 1 within a range in which the absolute value of the input reflection of the peak amplifier 19 is larger than 0 and smaller than about 0.72, as illustrated in FIG. 7.

In a case where the proportionality coefficient w is 0.4, power to be distributed to the carrier amplifier 18 is more than power to be distributed to the peak amplifier 19 when the absolute value of the input reflection of the peak amplifier 19 is within a range of less than 1 and equal to or greater than about 0.72. That is, power to be distributed to the carrier amplifier 18 is more than power to be distributed to the peak amplifier 19 during the period from the linear operation to the backoff of the Doherty amplifier 10.

In addition, power to be distributed to the peak amplifier 19 is more than power to be distributed to the carrier amplifier 18 when the absolute value of the input reflection of the peak amplifier 19 is within a range smaller than about 0.72 and larger than 0. That is, power to be distributed to the peak amplifier 19 is more than power to be distributed to the carrier amplifier 18 during the period from the backoff to the saturation operation of the Doherty amplifier 10.

Therefore, it is possible to allow the carrier amplifier 18 to start the signal amplification operation before the peak amplifier 19, and then allow the peak amplifier 19 to rapidly start the signal amplification operation. In addition, when the absolute value of the input reflection of the peak amplifier 19 is 0 and the peak amplifier 19 reaches saturation, the power division ratio $P_2/P_3$ is the desired power division ratio $1/K^2$. That is, when the absolute value of the input reflection of the peak amplifier 19 is 0, both the carrier amplifier 18 and the peak amplifier 19 are saturated.

Figure 8:
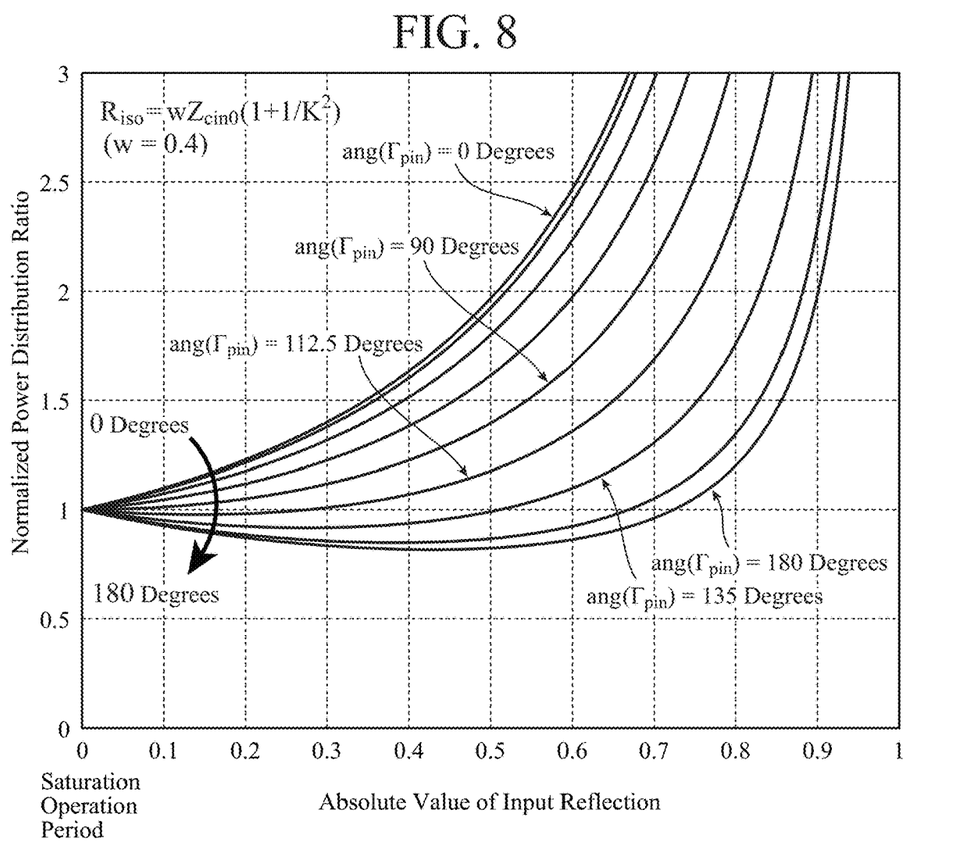
FIG. 8 is an explanatory diagram illustrating a normalized power division ratio when the phase of the reflection coefficient $\Gamma_{pin}$ of a second signal is changed from 0 degrees to 180 degrees in steps of 22.5 degrees, in a case where the proportionality coefficient w is 0.4.

FIG. 8 is an explanatory diagram illustrating a normalized power division ratio when the phase of the reflection coefficient $\Gamma_{pin}$ of the second signal is changed from 0 degrees to 180 degrees in steps of 22.5 degrees, in a case where the proportionality coefficient w is 0.4.

In FIG. 8, the horizontal axis represents an absolute value of the input reflection of the peak amplifier 19, and the vertical axis represents a normalized power division ratio during the period from the linear operation to the saturation operation of the Doherty amplifier 10. The normalized power division ratio is obtained by normalizing the power division ratio $P_2/P_3$ by $1/K^2$.

In the example of FIG. 8, when the phase of the reflection coefficient $\Gamma_{pin}$ of the second signal is within a range from 135 degrees to 180 degrees, there is an absolute value of the input reflection of the peak amplifier 19 at which the normalized power division ratio is smaller than 1.

However, in the example of FIG. 8, when the phase of the reflection coefficient $\Gamma_{pin}$ of the second signal is within a range from 0 degrees to 90 degrees, there is no absolute value of the input reflection of the peak amplifier 19 at which the normalized power division ratio is smaller than 1.

In addition, since Equation (8) indicating the power division ratio $P_2/P_3$ during the period from the linear operation to the backoff represents an even function with respect to the phase of the reflection coefficient $\Gamma_{pin}$ of the second signal, there is also an absolute value of the input reflection of the peak amplifier 19 in which the normalized power division ratio is smaller than 1 when the phase of the reflection coefficient $\Gamma_{pin}$ is within a range from 180 degrees to 225 degrees.

However, when the phase of the reflection coefficient $\Gamma_{pin}$ of the second signal is within a range from 270 degrees to 360 degrees, there is no absolute value of the input reflection of the peak amplifier 19 at which the normalized power division ratio is smaller than 1.

From the above, there is a phase condition of the reflection coefficient $\Gamma_{pin}$ that can achieve the ideal operation of the Doherty amplifier 10.

Figure 9:
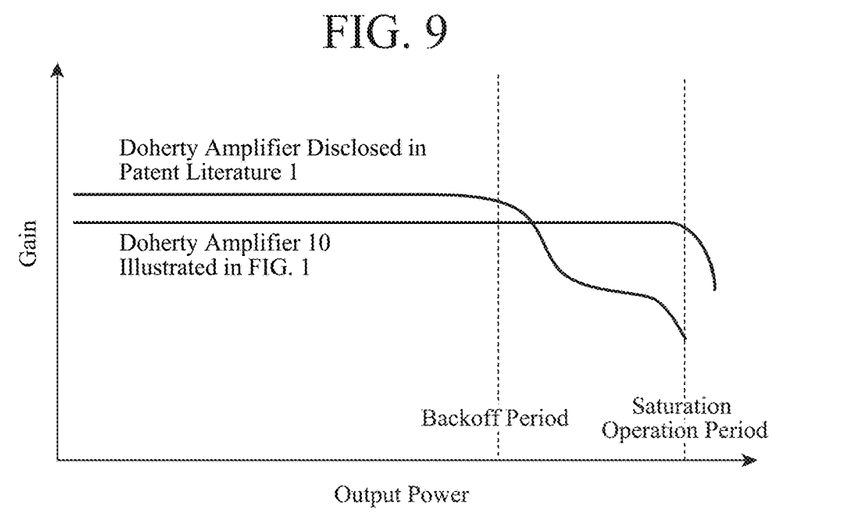
FIG. 9 is an explanatory diagram illustrating a gain with respect to output power of the Doherty amplifier 10 that satisfies a phase condition of the reflection coefficient $\Gamma_{pin}$ by which an ideal operation can be achieved and that has a proportionality coefficient w equal to or greater than 0 but less than 1.

FIG. 9 is an explanatory diagram illustrating a gain with respect to the output power of the Doherty amplifier 10 that satisfies the phase condition of the reflection coefficient $\Gamma_{pin}$ by which the ideal operation can be achieved and that has the proportionality coefficient w smaller than 1 and equal to or greater than 0.

In the Doherty amplifier described in Patent Literature 1, the peak amplifier cannot rapidly start the signal amplification operation at the backoff, so that the gain rapidly decreases during the period from the backoff to the saturation operation. Thus, gain characteristics are nonlinear.

In the Doherty amplifier 10 illustrated in FIG. 1, the peak amplifier 19 can rapidly start signal amplification operation at the backoff, so that flatness of gain can be maintained during the period from the backoff to the saturation operation. In addition, in the Doherty amplifier 10 illustrated in FIG. 1, the carrier amplifier 18 and the peak amplifier 19 can be saturated at the same time, and thus, the saturation output power increases as compared with the Doherty amplifier described in Patent Literature 1.

The Doherty amplifier described in Patent Literature 1 includes a delay circuit in order to address a problem that the gain of the combined signal is reduced because the two divided signals are output from the isolation resistance variable divider before the control circuit completes varying the division ratio.

The Doherty amplifier 10 illustrated in FIG. 1 prevents a decrease in gain of a combined signal without a control circuit as described in Patent Literature 1, so that the Doherty amplifier 10 illustrated in FIG. 1 does not need to have a delay circuit as described in Patent Literature 1. Therefore, this Doherty amplifier 10 illustrated in FIG. 1 does not have a problem that the Doherty amplifier cannot output an amplified signal until the delay time of the delay circuit elapses after the input signal is input to the delay circuit.

Note that, since the Doherty amplifier 10 illustrated in FIG. 1 does not include a detection circuit, a control circuit, and a delay circuit as described in Patent Literature 1, it is possible to achieve miniaturization and simplification and to reduce power consumption as compared with the Doherty amplifier described in Patent Literature 1.

In the first embodiment described above, the Doherty amplifier 10 is configured in such a manner that: the ratio $Z_3/Z_2$ of the characteristic impedance $Z_3$ of the second transmission line 13 to the characteristic impedance $Z_2$ of the first transmission line 12 is the power division ratio $P_2/P_3$ of a signal to be amplified between the carrier amplifier 18 and the peak amplifier 19 when both of the carrier amplifier 18 and the peak amplifier 19 are saturated; and the resistance value $R_{iso}$ of the resistor 14 is a value obtained by multiplying, by the proportionality coefficient w which is equal to or greater than 0 but less than 1, the sum of the input impedance $Z_{cin0}$ of the carrier amplifier 18 when the carrier amplifier 18 reaches saturation and the input impedance $Z_{pin0}$ of the peak amplifier 19 when the peak amplifier 19 reaches saturation. Therefore, the Doherty amplifier 10 can prevent a decrease in gain of the combined signal of the signal output from the carrier amplifier 18 and the signal output from the peak amplifier 19 during the period from the backoff to the saturation operation without having a delay circuit that delays the signal to be amplified.

Second Embodiment

Figure 10:
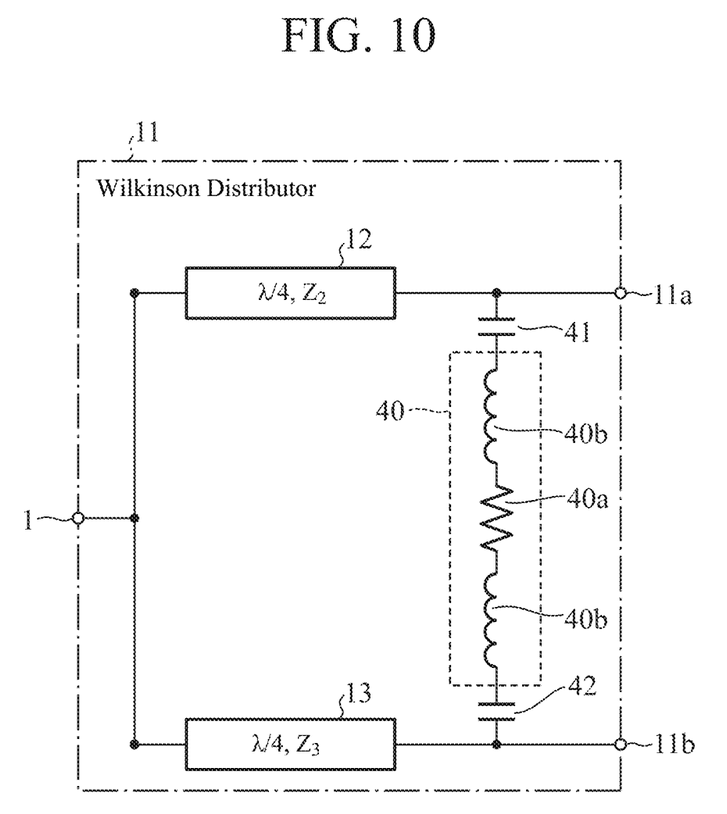
FIG. 10 is a configuration diagram illustrating a Wilkinson divider 11 of a Doherty amplifier 10 according to a second embodiment.

A second embodiment will describe a Doherty amplifier 10 in which a Wilkinson divider 11 includes capacitors 41 and 42 connected in series with a resistor 40.

FIG. 10 is a configuration diagram illustrating the Wilkinson divider 11 of the Doherty amplifier 10 according to the second embodiment. In FIG. 10, elements that are the same as or correspond to the elements in FIG. 1 are identified by the same reference numerals, and thus, the description thereof will be omitted.

The resistor 40 has a parasitic inductance 40b in addition to a resistor 40a having a resistance value of $R_{iso}$.

A first end of the capacitor 41 is connected to each of the second end of the first transmission line 12 and the output terminal 11a, and a second end of the capacitor 41 is connected to a first end of the resistor 40.

A first end of the capacitor 42 is connected to the second end of the second transmission line 13 and the output terminal 11b, and a second end of the capacitor 42 is connected to a second end of the resistor 40.

Each of the capacitor 41 and the capacitor 42 is provided to compensate for phase rotation of the first signal and the second signal which is caused by the resistor 40 having the parasitic inductance 40b.

Since the Wilkinson divider 11 includes the capacitors 41 and 42 connected in series with the resistor 40, a decrease in gain of the combined signal can be prevented, as in the Doherty amplifier 10 illustrated in FIG. 1, despite the resistor 40 having the parasitic inductance 40b.

In a case where a signal to be amplified is a communication signal, a communication device including the Doherty amplifier illustrated in FIG. 1 may be configured as an amplifier that amplifies the communication signal.

Figure 11:
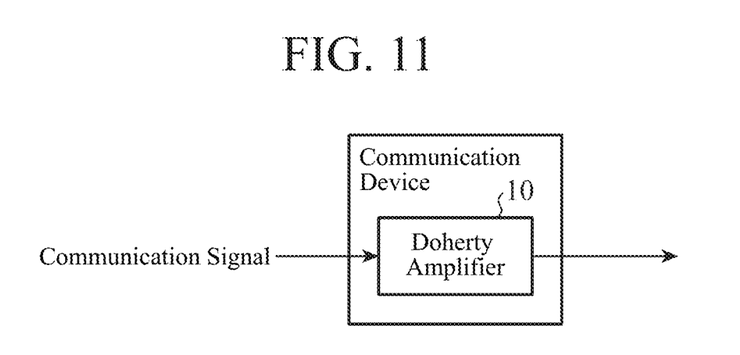
FIG. 11 is a configuration diagram illustrating a communication device including the Doherty amplifier 10 illustrated in FIG. 1.

FIG. 11 is a configuration diagram illustrating a communication device including the Doherty amplifier 10 illustrated in FIG. 1.

The Doherty amplifier illustrated in FIG. 1 does not include a delay circuit as described in Patent Literature 1. Therefore, the communication device illustrated in FIG. 11 can amplify the communication signal without a delay of the communication signal corresponding to the delay time of the delay circuit.

The communication device illustrated in FIG. 11 includes the Doherty amplifier 10 illustrated in FIG. 1, but may include the Doherty amplifier 10 including the Wilkinson divider 11 illustrated in FIG. 10.

It is to be noted that, in the present disclosure, two of the above embodiments can be freely combined, or any component in the embodiments can be modified or omitted.

INDUSTRIAL APPLICABILITY

The present disclosure is suitable for a Doherty amplifier and a communication device.

REFERENCE SIGNS LIST

1: Input terminal, 2: load, 10: Doherty amplifier, 11: Wilkinson divider, 11a and 11b: Output terminal, 12: First transmission line, 13: Second transmission line, 14: Resistor, 15: Phase adjustment line, 16: Coefficient adjustment line, 17: Phase adjustment line, 18: Carrier amplifier, 18a: Transistor, 18b: Input matching circuit, 18c: Output matching circuit, 18d: Stabilization circuit, 19: Peak amplifier, 19a: Transistor, 19b: Input matching circuit, 19c: Output matching circuit, 19d: Stabilization circuit, 20: Quarter wavelength line, 21: Output combining point, 22: Output matching circuit, 30: Range of input reflection phase, 40: Resistor, 40a: Resistor, 40b: Parasitic inductance, 41 and 42: Capacitor

The invention claimed is:
1. A Doherty amplifier comprising:
a first transmission line having a first end connected to an input terminal to which a signal to be amplified is input;
a second transmission line having a first end connected to the input terminal;
a resistor connected between a second end of the first transmission line and a second end of the second transmission line;
a carrier amplifier to amplify a signal output from the second end of the first transmission line and output the amplified signal to an output combining point; and
a peak amplifier to amplify a signal output from the second end of the second transmission line and output the amplified signal to the output combining point,
wherein the Doherty amplifier is configured such that:
a ratio of a characteristic impedance of the second transmission line to a characteristic impedance of the first transmission line is a power division ratio of the signal to be amplified between the carrier amplifier and the peak amplifier when both of the carrier amplifier and the peak amplifier are saturated, and
a resistance value of the resistor is a value obtained by multiplying, by a proportionality coefficient that is equal to or greater than 0 but less than 1, a sum of an input impedance of the carrier amplifier when the carrier amplifier reaches saturation and an input impedance of the peak amplifier when the peak amplifier reaches saturation,
wherein the Doherty amplifier further comprises:
a coefficient adjustment line that is connected between the second end of the second transmission line and the peak amplifier and adjusts a reflection coefficient of a signal at the peak amplifier, which is obtained when the peak amplifier is viewed from the second end of the second transmission line; and
a phase adjustment line that is connected between the second end of the first transmission line and the carrier amplifier and has an electrical length same as an electrical length of the coefficient adjustment line.

2. The Doherty amplifier according to claim 1, further comprising a capacitor connected in series with the resistor.

3. A communication device, wherein the signal to be amplified is a communication signal, the communication device comprising the Doherty amplifier according to claim 1 as an amplifier to amplify the communication signal.

4. A communication device, wherein the signal to be amplified is a communication signal, the communication device comprising the Doherty amplifier according to claim 2 as an amplifier to amplify the communication signal.

5. The Doherty amplifier according to claim 1, further comprising a capacitor connected in series with the resistor.

6. A Doherty amplifier comprising:
a first transmission line having a first end connected to an input terminal for receiving a signal to be amplified from the outside of the Doherty amplifier;
a second transmission line having a first end connected to the input terminal;
a resistor connected between a second end of the first transmission line and a second end of the second transmission line;
a carrier amplifier to amplify a signal output from the second end of the first transmission line and output the amplified signal to an output combining point,
wherein the carrier amplifier is configured to be biased to class AB; and
a peak amplifier to amplify a signal output from the second end of the second transmission line and output the amplified signal to the output combining point,
wherein the peak amplifier is configured to be biased to class C;
wherein the Doherty amplifier is configured such that:
a ratio of a characteristic impedance of the second transmission line to a characteristic impedance of the first transmission line is a power division ratio of the signal to be amplified between the carrier amplifier and the peak amplifier when both of the carrier amplifier and the peak amplifier are saturated, and
a resistance value of the resistor is a value obtained by multiplying, by a proportionality coefficient that is greater than 0 but less than 1, a sum of an input impedance of the carrier amplifier when the carrier amplifier reaches saturation and an input impedance of the peak amplifier when the peak amplifier reaches saturation, wherein the Doherty amplifier further comprises:

a coefficient adjustment line that is connected between the second end of the second transmission line and the peak amplifier and is so configured that a phase of an input reflection of the peak amplifier during a period from a linear operation to a saturation operation of the Doherty amplifier, is included in a designed range for achieving ideal operation of the Doherty amplifier; and a phase adjustment line that is connected between the second end of the first transmission line and the carrier amplifier and has an electrical length same as an electrical length of the coefficient adjustment line.

7. A communication device, wherein the signal to be amplified is a communication signal, the communication device comprising the Doherty amplifier according to claim 6 as an amplifier to amplify the communication signal.

8. A communication device, wherein the signal to be amplified is a communication signal, the communication device comprising the Doherty amplifier according to claim 5 as an amplifier to amplify the communication signal.

* * * * *